(12) United States Patent
Lee

(10) Patent No.: US 8,092,986 B2
(45) Date of Patent: Jan. 10, 2012

(54) EXPOSURE METHODS

(75) Inventor: Jun Seok Lee, Goyang (KR)

(73) Assignee: Dongbu Electronics Co., Ltd., Seoul (KR)

( * ) Notice: Subject to any disclaimer, the term of this patent is extended or adjusted under 35 U.S.C. 154(b) by 1863 days.

(21) Appl. No.: 11/025,123

(22) Filed: Dec. 28, 2004

(65) Prior Publication Data

US 2005/0142500 A1     Jun. 30, 2005

(30) Foreign Application Priority Data

Dec. 31, 2003    (KR) .................. 10-2003-0101384

(51) Int. Cl.
*G03F 7/20* (2006.01)
(52) U.S. Cl. ...................... 430/394; 430/5; 430/311
(58) Field of Classification Search ........... 430/5, 394, 430/311, 322
See application file for complete search history.

(56) References Cited

U.S. PATENT DOCUMENTS

| | | | |
|---|---|---|---|
| 6,251,564 B1* | 6/2001 | Lin et al. | 430/311 |
| 6,489,083 B1* | 12/2002 | Smith et al. | 430/313 |
| 7,008,735 B2* | 3/2006 | Yang | 430/5 |
| 2003/0064300 A1* | 4/2003 | Watanabe | 430/5 |
| 2005/0031967 A1* | 2/2005 | Ito | 430/5 |

* cited by examiner

*Primary Examiner* — Kathleen Duda
*Assistant Examiner* — Brittany Raymond
(74) *Attorney, Agent, or Firm* — The Law Offices of Andrew D. Fortney; Andrew D. Fortney

(57) ABSTRACT

The present disclosure provides an exposure method for a semiconductor device, in which whether a specific pattern corresponds to a sparse area or a dense area is decided to employ a specific phase-shift mask and by which critical dimension uniformity and resolution of the pattern are enhanced. One example method includes defining a hole area for a plurality of holes into a dense area and a sparse area, coating a photoresist layer on a substrate having a plurality of elements formed thereon, carrying out a first exposure on the photoresist layer using a first photomask having patterns corresponding to the dense and sparse areas, respectively, and carrying out a second exposure on the photoresist layer using a second photomask having at least two halftone layers provided to portions corresponding to the dense and sparse areas, respectively wherein the at least two halftone layers differ from each other in transmitivity, respectively.

20 Claims, 6 Drawing Sheets a b

EXPOSURE METHODS

TECHNICAL FIELD

The present disclosure relates to semiconductor processing and, more particularly, to exposure methods for use in semiconductor manufacturing.

BACKGROUND

Generally, photolithography is an essential process that is used in semiconductor device fabrication. Photolithograph is carried out in a manner of coating a photoresist layer on a wafer, carrying out exposure on the photoresist layer using a photomask having a prescribed layout, developing the exposed photoresist layer into a photoresist pattern corresponding to the prescribed layout.

As design rules are lowered according to the rising degree of semiconductor device integration, a defect is caused to a pattern by optical proximity effect (OPE) with a neighbor pattern in performing photolithography. Namely, in case of forming a rectangular pattern, corner rounding takes place by optical diffraction and interference to form rounded corners of the rectangular pattern. Moreover, a pattern size in a dense area having patterns formed densely is formed smaller than that in a sparse area where patterns are sparse. This is attributed to OPE as well. The OPE is explained with reference to the drawings as follows.

Referring to FIG. 1, in case of forming a plurality of contact holes having the same diameter by etching portions of an insulating interlayer 102 formed over a semiconductor substrate 101, an opening d2 of a photoresist pattern 103 in an sparse area B is formed smaller than an opening d1 of the photoresist pattern 103 in an dense area A owing to the OPE. Hence, a contact hole 104b in the sparse area B is patterned relative small in diameter (cf. FIG. 2A and FIG. 2B). In doing so, the photoresist pattern 103 is formed using a general photomask consisting of a glass substrate 111 and a shield layer 112.

To suppress the OPE and to improve resolution, optical proximity correction, phase shift, and the like have been proposed. The optical proximity correction corrects diffraction and interference of light using an optical proximity correction pattern. The phase shift implements an interference effect to lower a space frequency of a pattern or to raise contrast of a specific position by making a light phase shifted appropriately using a predetermined phase shift mask.

The phase shift mask is categorized into a strong type and a weak type according to a mask manufacturing method and an amplitude of a phase shifted area. The strong type phase shift masks are divided into alternating, outrigger, and rim types. Moreover, an attenuated type phase shift mask belongs to the weak type. The attenuated type phase shift mask is called a half-tone phase shift mask capable of shifting a phase and adjusting transmitivity by a material selection.

FIG. 3 is a perspective diagram of a general halftone phase shift mask. Referring to FIG. 3, a halftone phase shift mask 300 is generally provided on a glass substrate 301. A halftone layer 302 having an opening, i.e., an exposure area, for forming a micro pattern is formed on the glass substrate 301. A shield layer 303 is formed on the halftone layer 302 having an opening bigger than that of the halftone layer 302. The shield layer 303 is generally a Cr layer. The halftone layer 302 consists of a $Cr_2O_3$ layer having a prescribed refractive index, a CrN layer having a prescribed refractive index, a MoSi layer having a prescribed refractive index, and the like. Moreover, the halftone mask 302 can be adjusted to have transmitivity of 70~95% according to the material selection.

Meanwhile, according to high degree of semiconductor device integration and various kinds of devices provided to one chip, patterns are arranged within the device regularly or irregularly. Yet, in case that circuit patterns are complicatedly arranged, it is difficult to use the phase shift mask with a uniform reference. Namely, in forming patterns in the sparse and dense areas, respectively, OPC or a specific phase shift mask should be applied with consideration of pattern sizes and density.

However, as the definitions of sparse and dense areas are vague, it is difficult to specify a phase shift mask to be used.

DETAILED DESCRIPTION

Figure 1:
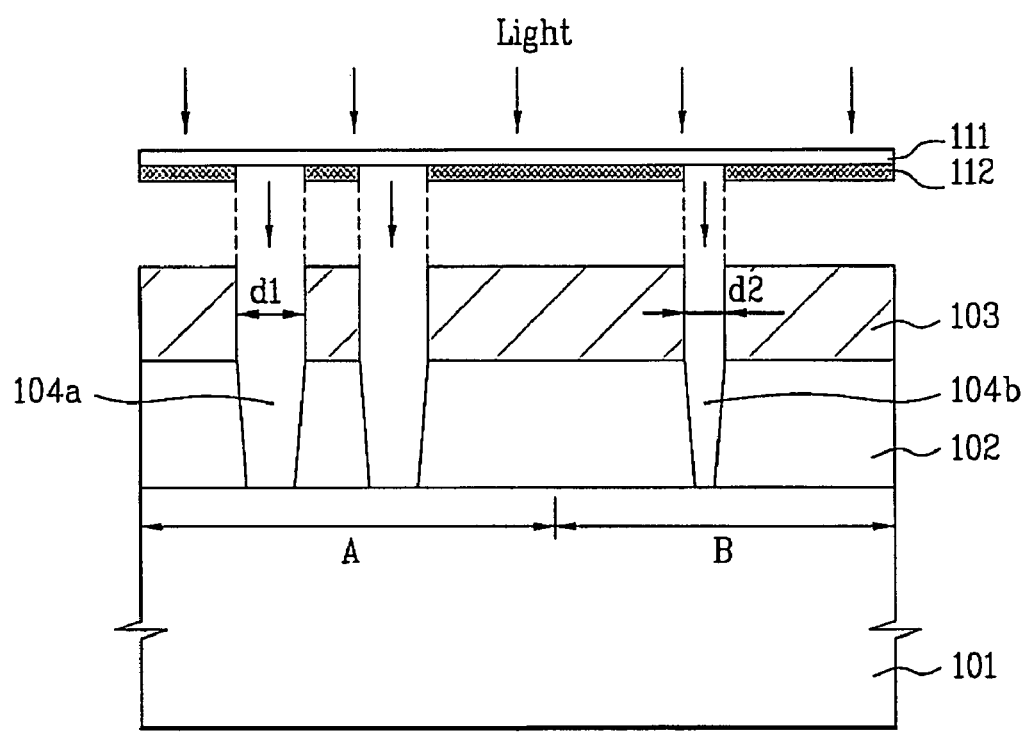
FIG. 1 is a cross-sectional diagram for explaining optical proximity effect.
Figure 2A:
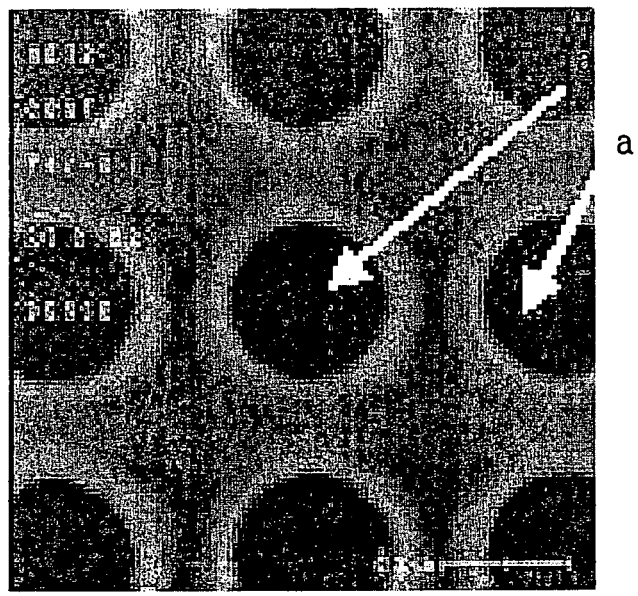
FIG. 2A and FIG. 2B are scanning electron microscope (SEM) pictures of contact holes in dense and sparse areas, respectively.
Figure 2B:
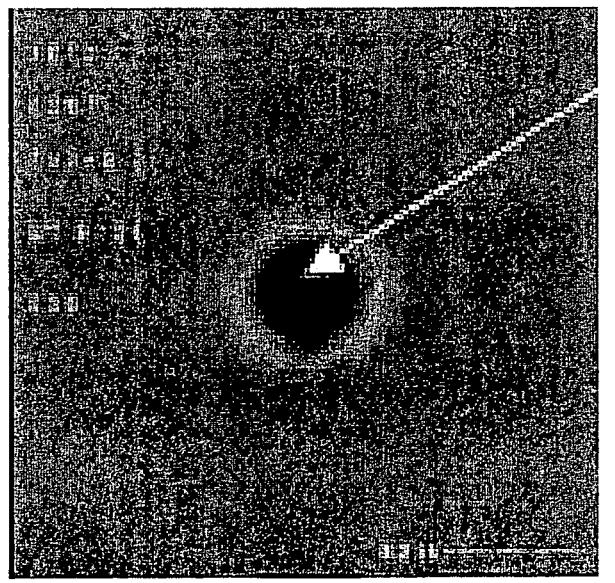
Figure 3:
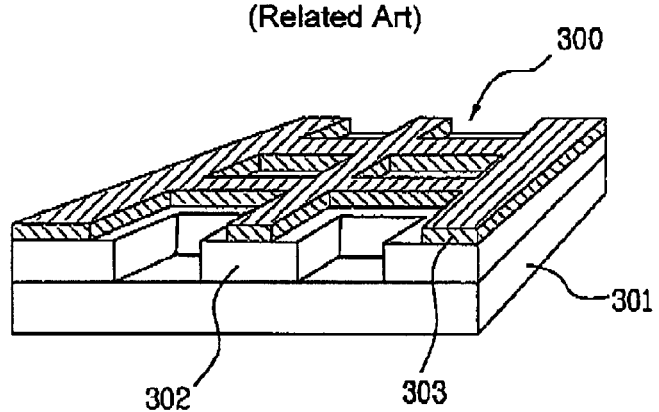
FIG. 3 is a perspective diagram of a general halftone phase shift mask.
Figure 4:
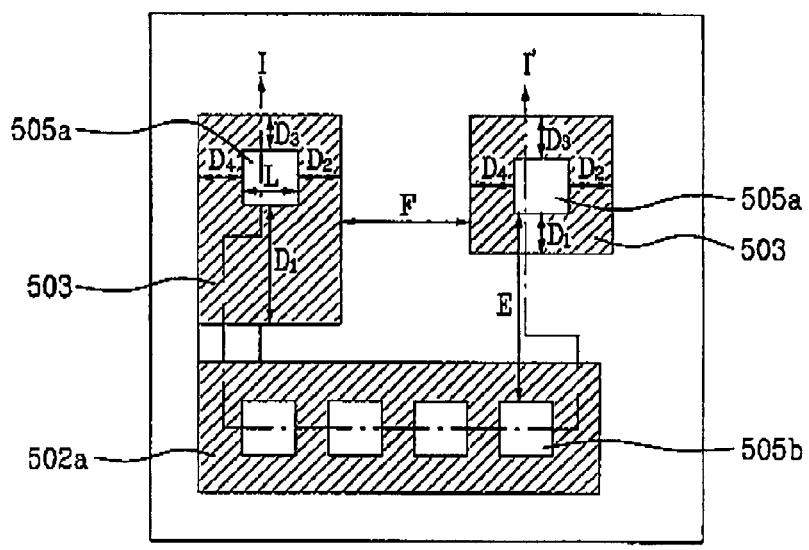
FIG. 4 is a layout for explaining an example of the disclosed exposure method.

Referring to FIG. 4, a dense area having high pattern density such as a memory cell area and a sparse area having low pattern density such as a logic area are formed on a semiconductor device. FIG. 4 shows various contact holes such as a contact hole 505b in the dense area and a contact hole 505a in the sparse area.

Figure 5:
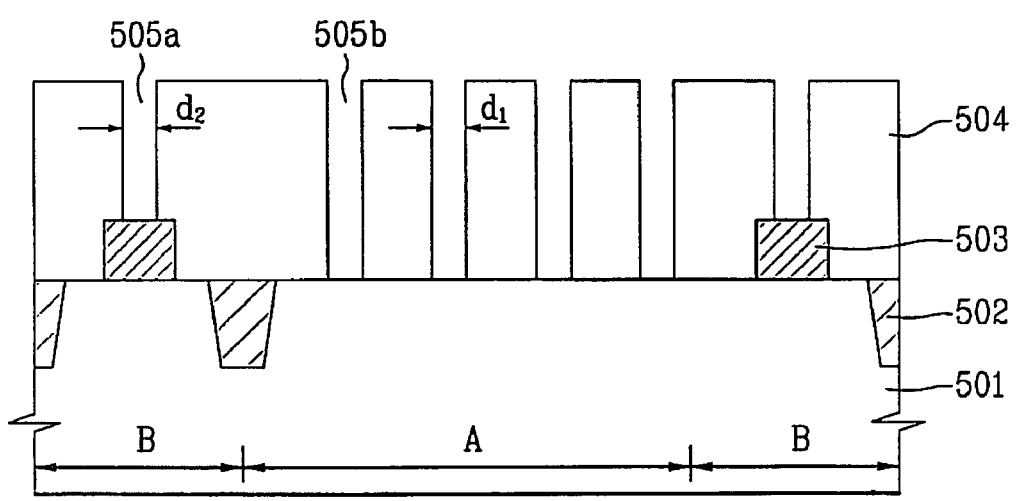
FIG. 5 is a cross-sectional diagram along a cutting line I-I' in FIG. 4

Referring to FIG. 5, the semiconductor substrate is divided into the dense area having high pattern density and the sparse area having low pattern density. An active area is defined by a device isolation layer 502. A plurality of gates 503 are formed on a prescribed area of the semiconductor substrate 501. An insulating interlayer 504 is formed over the substrate 501 including the gates 503. Portions of the insulating interlayer 504 are etched to form contact holes exposing prescribed portions of the active area and the gates 503. In doing so, the contact holes can be formed in both of the dense and sparse areas. It is assumed that diameters $d_1$ and $d_2$ of the contact holes are equal to each other. For purposes of explanation, the gates 503 can be replaced by metal lines, or metal lines may further provided to the substrate for example.

Meanwhile, in forming patterns of the dense and sparse areas, the diameter of the contact hole in the sparse area is patterned smaller than that in the dense area due to OPE. In the contact hole forming process in FIGS. 4 and 5, the optical proximity effect takes place in performing photolithography to bring about a difference in contact hole size. Accordingly, as disclosed herein, the following exposure methods prevent the pattern size difference from occurring between the dense and sparse areas.

First of all, it is defined whether a pattern to be defined belongs to the dense area or the sparse area. A plurality of contact holes, as shown in FIG. 4, are defined by the following rules. A diameter or one side length is 'L'. A distance between the gates 503 is 'F'. A shortest distance between neighbor contacts is 'E'. A distance between the contact hole and the active area or a distance between the contact hole and the gate 503 are '$D_1, D_2, D_3,$ and $D_4$' according to a vertical or horizontal direction.

Under the above definitions, each of the contact holes 505a belonging to the sparse area should meet the following conditions: $F \geq 4L$; $E \geq 2L$; and L is greater than at least three of the distances $D_1, D_2, D_3,$ and $D_4$.

Contact holes meeting the three conditions are the contact holes 505a of the sparse area. The remaining contact holes correspond to the contact holes 505b in the dense area. Moreover, a presence or non-presence of meeting the three conditions is recognizable using a circuit pattern copied to the photomask.

After completion of defining the contact hole 505a in the dense area and the contact holes 505b in the dense area, a contact hole forming process is regularly executed.

Figure 6A:
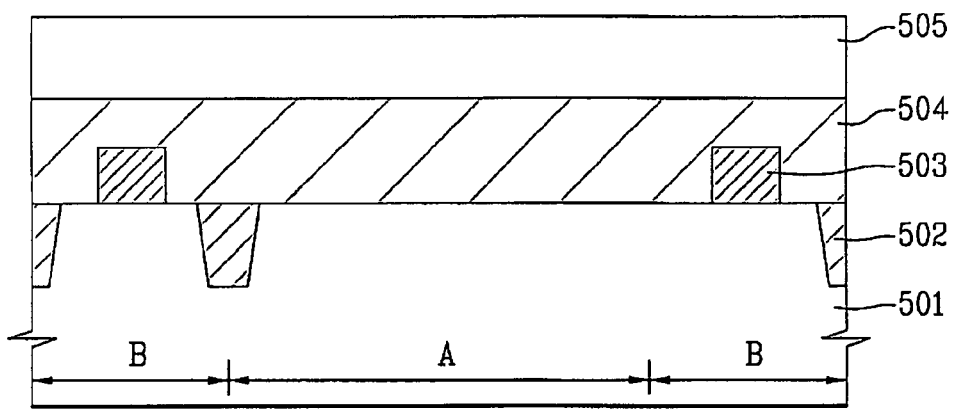
FIGS. 6A to 6D are cross-sectional diagrams along a cutting line I-I' showing a semiconductor device at various fabrications stages for explaining the disclosed methods.

Referring to FIG. 6A, an active area is defined on a semiconductor substrate 501 by a device isolation layer 502. A plurality of gates 503 are formed on a prescribed area of the semiconductor substrate 501. An insulating interlayer 504 is formed over the substrate 501 including the gates 503. Subsequently, a photoresist layer 505 is coated on the insulating interlayer 504.

Figure 6B:
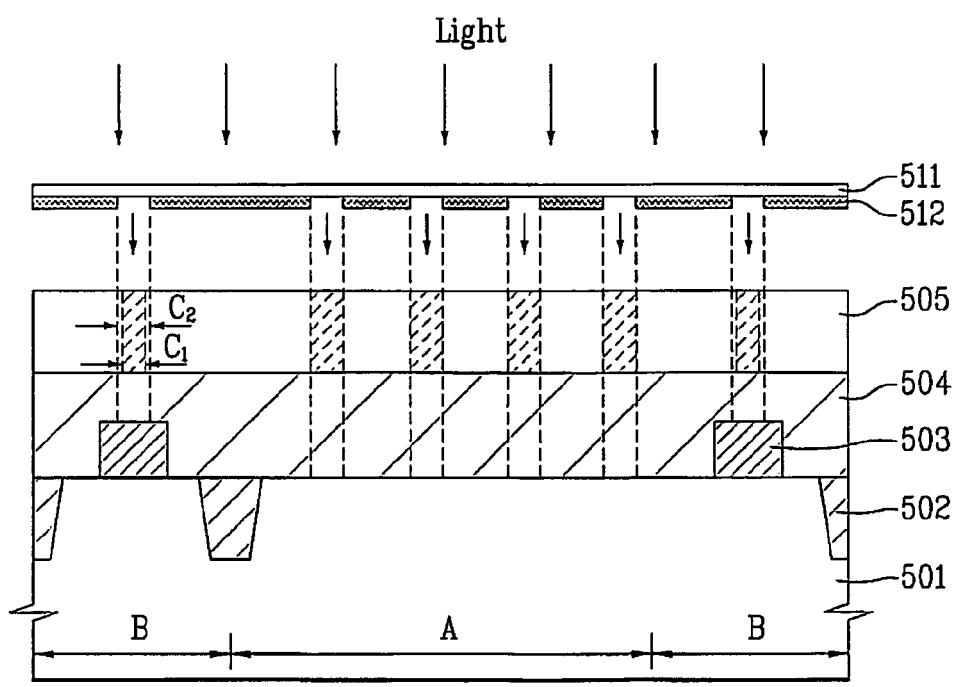

Referring to FIG. 6B, a first exposure is carried out on the photoresist layer 505 corresponding to portions of the insulating inter layer 504 where contact holes will be formed using a first photomask. In doing so, the first photomask is a general photomask including a glass substrate 511 and a shield layer 512.

In this case, the optical proximity effect occurs so that the exposure is made in a manner that a size $C_1$ of an exposed portion of the photoresist layer 505 is smaller than a size $C_2$ of a designed contact hole in the sparse area. In one example set of exposure equipment, a wavelength of a light source is 248 nanometers (nm), a numerical aperture (NA) is 0.6, and a sigma is 0.48.

Figure 6C:
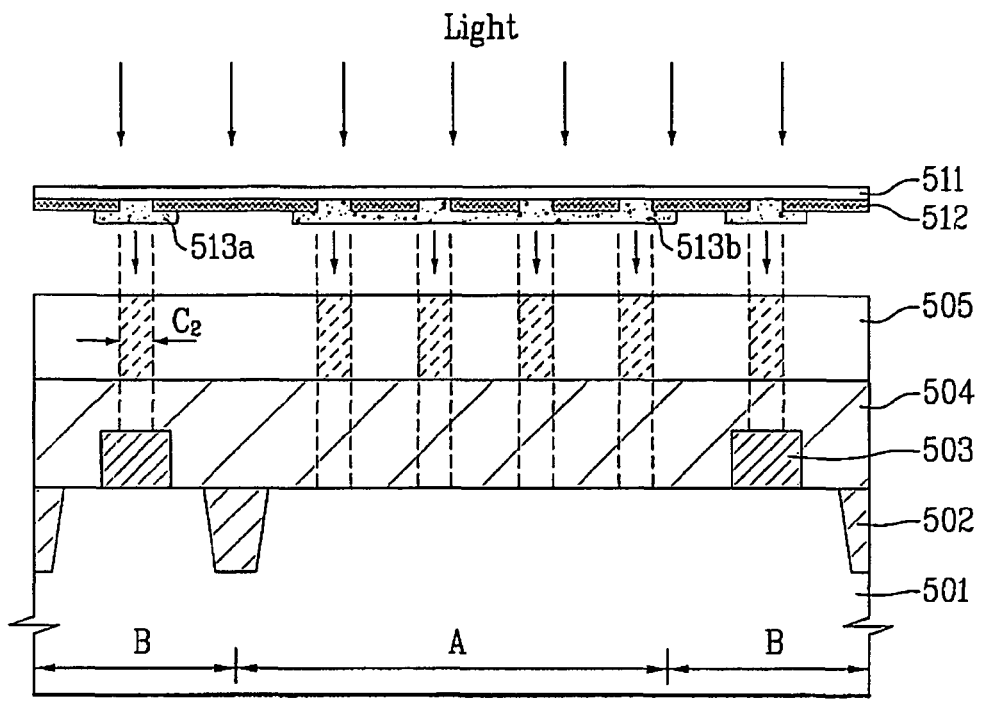

Referring to FIG. 6C, while the photoresist layer 505 after completion of the first exposure is not developed, a second exposure is carried out on the photoresist layer 505 using a second photomask. In doing so, the second photomask is a halftone phase shift mask. The second photomask includes a 95%-transmitivity halftone layer 513a provided to a portion exposing contact holes in the sparse area and a 90%-transmitivity halftone layer 513b provided to a portion exposing the contact holes in the dense area. In this case, the second photomask includes the halftone layers 513a and 513b differing from each other in transmitivity according to the sparse area and the dense area. And, the halftone layers 513a and 513b are provided to the openings of the first photomask. Hence, the exposure intensity applied to the photoresist layer 505 corresponding to the contact holes in the sparse area is made greater than the exposure intensity applied to the photoresist layer 505 corresponding to the contact holes in the dense area. Thus, the photoresist layer 505 corresponding to the contact holes in the sparse area, which is exposed smaller than the real contact hole size each due to the optical proximity effect, is exposed relatively more than that in the dense area. Therefore, the openings $C_2$ of the photoresist layer 505 are equal to each other in size.

Figure 6D:
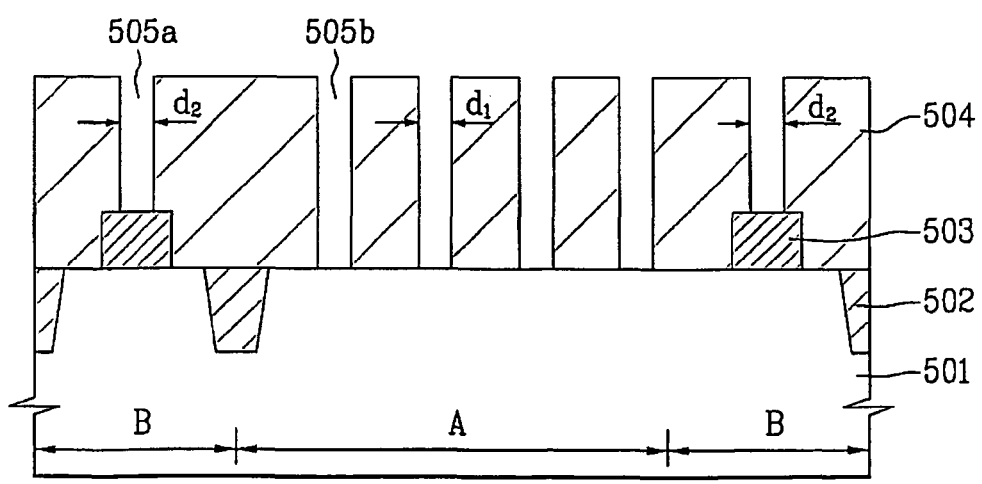

Referring to FIG. 6D, the photoresist layer 505 is developed to form a photoresist pattern 505 defining a plurality of contact holes.

Subsequently, the insulating interlayer 504 is etched using the photoresist pattern 505 as an etch mask to form a plurality of contact holes equal to each other in size $d_1$ or $d_2$, respectively.

As explained in the above description, the first exposure is carried out using the general photomask and the optical proximity effect attributed to the general photomask is corrected by the second exposure. Hence, a plurality of the contact holes can be formed uniform in size.

Meanwhile, the disclosed processes are also applicable to the via hole forming process for metal lines.

The disclosed processes have a number of advantages. First of all, the disclosed processes correct the optical proximity effect attributed to the general photomask in a manner of performing the second exposure using the halftone phase shift mask provided with different kinds of halftone layers differing in transmitivity. Therefore, the contact holes in the dense area can be formed uniform in size as well as the contact holes in the sparse area.

Disclosed herein is an exposure method that substantially obviates one or more problems due to limitations and disadvantages of the related art. In particular, the disclosed exposure methods determine whether a specific pattern corresponds to a sparse area or a dense area. Based on such a determination, it is decided to employ a specific phase-shift mask and by which critical dimension uniformity and resolution of the pattern are enhanced.

One particular example exposure method includes defining a hole area for a plurality of holes into a dense area and a sparse area, coating a photoresist layer on a substrate having a plurality of elements formed thereon, carrying out a first exposure on the photoresist layer using a first photomask having patterns corresponding to the dense and sparse areas, respectively, and carrying out a second exposure on the photoresist layer using a second photomask having at least two halftone layers provided to portions corresponding to the dense and sparse areas, respectively wherein the at least two halftone layers differ from each other in transmitivity, respectively.

In one example, a diameter or one side length is 'L', a distance between the elements on the substrate is 'F', a shortest distance between neighbor holes is 'E', and a distance between the hole and the element are '$D_1, D_2, D_3,$ or $D_4$' according to a vertical or horizontal direction, the hole area for a plurality of the holes is defined in a manner that each of the holes belonging to the sparse area meets the following conditions: $F \geq 4L$; $E \geq 2L$; and L is greater than at least three of the distances $D_1, D_2, D_3,$ and $D_4$, and the rest holes fail to meet the conditions belong to the dense area.

In one example, a 95%-transmitivity halftone layer is provided to the portion corresponding to the sparse area and a 90%-transmitivity halftone layer is provided to the portion corresponding to the dense area. The plurality of the elements may be gates or metal lines.

This application claims the benefit of the Korean Application No. P2003-0101384 filed on Dec. 31, 2003, which is hereby incorporated by reference.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. An exposure method comprising:
defining a hole area for a plurality of holes into a dense area and a sparse area;
coating a photoresist layer on a substrate having a plurality of elements formed thereon;

carrying out a first exposure on the photoresist layer using a first photomask having patterns corresponding to the dense and sparse areas, respectively; and carrying out a second exposure on the photoresist layer using a second photomask comprising a first halftone layer having a first transmissivity in the dense area and a second halftone layer having a second transmissivity in the sparse area.

2. An exposure method as defined by claim 1, wherein a diameter or one side length of each of the plurality of holes is 'L', a distance between the elements on the substrate is 'F', a shortest distance between neighbor holes is 'E', and a distance between each hole and a nearest element is '$D_1, D_2, D_3,$ or $D_4$' according to a vertical or horizontal direction, wherein each of the holes belonging to the sparse area meets the following conditions: $F \geq 4L$; $E \geq 2L$; and L is greater than at least three of the distances $D_1, D_2, D_3$, and $D_4$, and holes that fail to meet the conditions belong to the dense area.

3. An exposure method as defined by claim 1, wherein the first transmissivity is less than the second transmissivity.

4. The method of claim 3, wherein the second halftone layer has a transmissivity of 95% and the first halftone layer has a transmissivity of 90%.

5. An exposure method as defined by claim 1, wherein a plurality of the elements are gates or metal lines.

6. The method of claim 1, wherein a diameter of the holes in the dense area is equal to a diameter of the holes in the sparse area.

7. The method of claim 1, wherein a geometric area of an exposed photoresist corresponding to the sparse area is smaller than a geometric area of an exposed photoresist corresponding to the dense area.

8. The method of claim 1, wherein the first photomask comprises a glass substrate and a shield layer.

9. The method of claim 8, wherein the second photomask comprises a halftone phase shift mask.

10. The method of claim 1, wherein the second photomask comprises a halftone phase shift mask.

11. The method of claim 1, wherein the holes in the dense area and the holes in the sparse area are uniform in size.

12. The method of claim 1, further comprising developing the photoresist layer.

13. The method of claim 1, further comprising forming the plurality of holes.

14. The method of claim 1, wherein the elements comprise gates or metal lines.

15. The method of claim 14, wherein each of the plurality of holes exposes gates or metal lines.

16. The method of claim 1, wherein each of the plurality of holes exposes gates or metal lines.

17. The method of claim 1, further comprising forming an insulating layer over the substrate.

18. The method of claim 17, further comprising etching the insulating layer.

19. The method of claim 18, wherein etching the insulating layer comprises using the exposed photoresist layer as an etch mask.

20. The method of claim 18, wherein etching the insulating layer forms a plurality of contact holes equal to each other in diameter.

* * * * *